US010986736B2

(12) United States Patent
Hawkins et al.

(10) Patent No.: US 10,986,736 B2
(45) Date of Patent: Apr. 20, 2021

(54) WORKPIECE TRANSFER AND PRINTING

(71) Applicant: ASM Assembly Systems Singapore Pte. Ltd., Singapore (SG)

(72) Inventors: Chris Hawkins, Axminster (GB); Jeffrey Richard Willshere, Dorchester (GB)

(73) Assignee: ASM ASSEMBLY SYSTEMS SINGAPORE PTE. LTD., Singapore (SG)

( * ) Notice: Subject to any disclaimer, the term of this patent is extended or adjusted under 35 U.S.C. 154(b) by 401 days.

(21) Appl. No.: 15/941,083

(22) Filed: Mar. 30, 2018

(65) Prior Publication Data

US 2018/0338378 A1   Nov. 22, 2018

(30) Foreign Application Priority Data

May 16, 2017  (GB) .................................. 1707878

(51) Int. Cl.

| | |
|---|---|
| *B41J 11/02* | (2006.01) |
| *H01L 21/68* | (2006.01) |
| *H05K 3/12* | (2006.01) |
| *B41F 15/26* | (2006.01) |
| *B41F 15/20* | (2006.01) |
| *B41F 15/08* | (2006.01) |
| *H05K 3/00* | (2006.01) |

(52) U.S. Cl.
CPC ....... *H05K 3/1216* (2013.01); *B41F 15/0881* (2013.01); *B41F 15/20* (2013.01); *B41F 15/26* (2013.01); *H05K 3/0085* (2013.01); *B41P 2215/50* (2013.01); *H05K 2203/0139* (2013.01); *H05K 2203/0195* (2013.01); *H05K 2203/166* (2013.01)

(58) Field of Classification Search
CPC .............................. H05K 3/0085; B41F 15/08
See application file for complete search history.

(56) References Cited

U.S. PATENT DOCUMENTS

| | | | | |
|---|---|---|---|---|
| 4,974,508 | A | * | 12/1990 | Andersen ............ B41F 15/0863 101/115 |
| 5,592,877 | A | * | 1/1997 | Szyszko .................. B41F 15/08 101/115 |
| 8,215,473 | B2 | * | 7/2012 | Baccini ............. H01L 21/67715 198/346.2 |
| 9,032,872 | B2 | | 5/2015 | Uptergrove |
| 2009/0305441 | A1 | | 12/2009 | Baccini et al. ................. 438/16 |
| 2012/0017783 | A1 | | 1/2012 | Uptergrove .................. 101/38.1 |

(Continued)

FOREIGN PATENT DOCUMENTS

| | | |
|---|---|---|
| CN | 103415396 A | 11/2013 |
| CN | 105835522 A | 8/2016 |

(Continued)

*Primary Examiner* — Cachet I Proctor
(74) *Attorney, Agent, or Firm* — Ostrolenk Faber LLP

(57) ABSTRACT

A printing apparatus for printing workpieces comprises a rotary table supporting first and second platens rotatable between a loading position located in-line between input and output lines. The transfer apparatus is operable to cyclically perform first and second movement operations, in which the rotary table rotates to move the first platen from a loading position to a printing position and vice versa. The platens may be rotatable relative to each other.

14 Claims, 13 Drawing Sheets

(56) References Cited

U.S. PATENT DOCUMENTS

| | | | | |
|---|---|---|---|---|
| 2012/0064250 A1* | 3/2012 | Baccini | ................. | B41F 15/26 427/282 |
| 2015/0107467 A1* | 4/2015 | Hoffman, Jr. | ........... | B41F 17/38 101/126 |
| 2016/0039223 A1* | 2/2016 | Shapira | ................... | B65H 5/04 347/14 |

FOREIGN PATENT DOCUMENTS

| | | | |
|---|---|---|---|
| EP | 2918410 A1 | | 9/2015 |
| JP | H1110832 A | | 1/1999 |
| JP | 2002225221 A | * | 8/2002 |
| WO | WO 2009/053786 A1 | | 4/2009 |

* cited by examiner

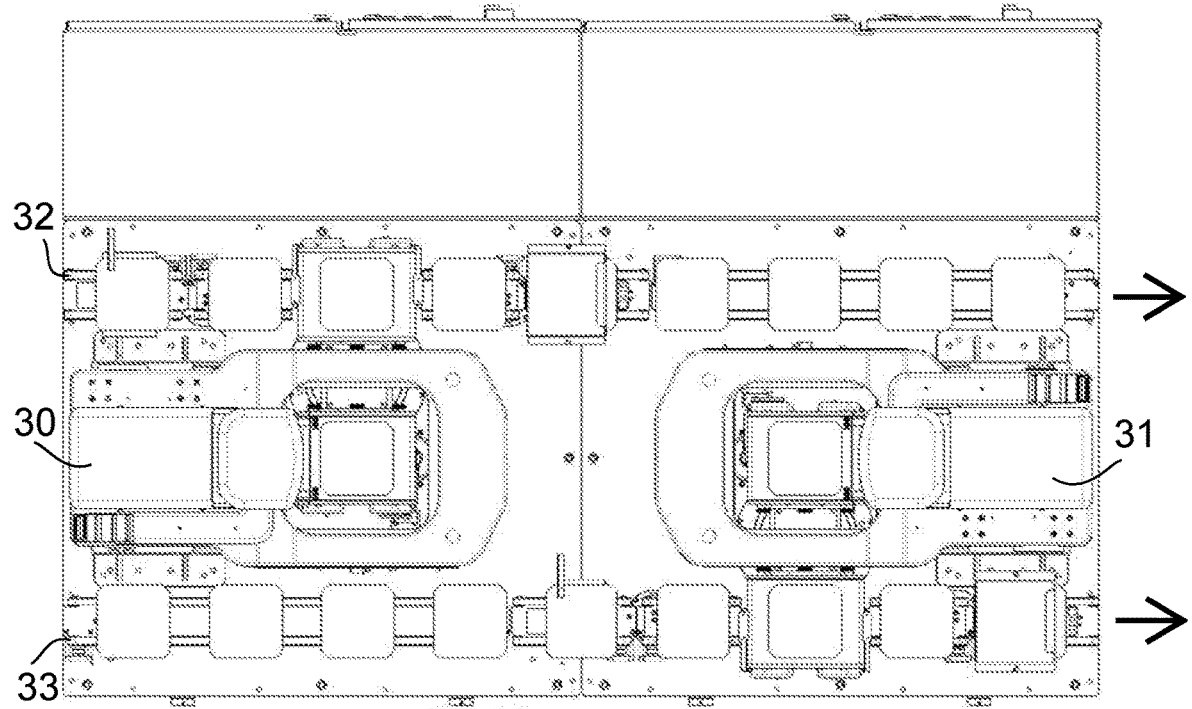
FIG. 10
FIG. 11
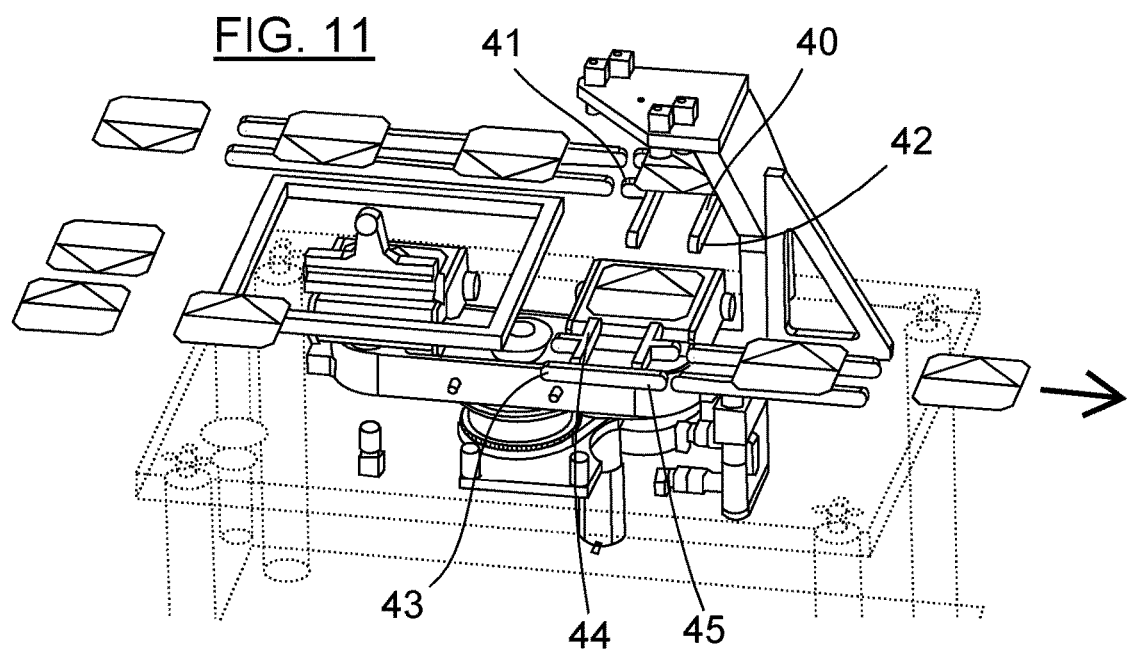

WORKPIECE TRANSFER AND PRINTING

CROSS-REFERENCE TO RELATED APPLICATION

The present application claims priority to United Kingdom Patent Application No. 1707878.3, filed May 16, 2017, the content of which is incorporated herein by reference.

This invention relates to a transfer apparatus for conveying workpieces between a production line and a printing unit, printing apparatuses for printing workpieces, a printing assembly and a method for printing workpieces.

BACKGROUND AND PRIOR ART

Workpieces such as semiconductor wafers or substrates are typically printed with conductive paste to form, for example, printed circuit boards (PCBs) or solar cells by a printing assembly. In conventional printing assemblies, the workpieces are conveyed on one or two production lines, such as conveyor belts, to a printing unit or station, and from there back to the production line or lines for conveyance to other equipment. Inspection of the workpieces, for example using optical inspection equipment, may be conducted at various points along the production lines of the assembly, and such inspection may be used for example to check the alignment of the workpieces both going to and leaving the printing station. Typically, conventional semiconductor or wafer printers, such as those used for printing circuit boards or solar cells, use rotary tables fitted with four platens to deliver workpieces to and from a printing station. An example of this is shown in U.S. Pat. No. 8,215,473 B2 (Applied Materials, Inc). Some alternative designs use an in-line feed. This latter is more compact but is generally slower, since less of the cycle can be run in parallel.

One particular solar cell printing machine, the "Eclipse" produced by ASM Assembly Systems, can operate parallel print engines to increase the output per print cell. However, due to the in-line feed to each print engine the Eclipse is limited to producing around 1,500 wafers per hour.

A key market trend is for dual-lane lines which are operated from a single side. The main benefit of this is that fewer operators are needed to run the line, and a reduction in overall cost is achieved when compared to two independent lines. The line footprint is also reduced by using the dual-lane architecture, thus allowing a greater wafer output per square metre of factory floor space.

It is clearly advantageous to increase the production of a printing machine, while using the preferred dual-lane line architecture. However, there are two main problems to be overcome:
i) Cycle Time Limitations:
One of the limits to printer cycle time is the speed with which wafers can be fed and replaced between printing.
ii) Inspection Limitations:
In printing systems which require a degree of accuracy, a vision system is employed to correct the wafer alignment before printing takes place. High accuracy systems generally require 5 to 10 micron alignment. Rotary table and in-line systems use a second vision system at an inspection station for checking quality and alignment of print. This increases complexity, line length and cost, and may also result in a number of wafers located between the printing station and inspection station potentially having undetected faults.

It is an aim of the present invention to increase the production of a printing machine, while retaining the dual lane line architecture. More particularly, the present invention has as its primary object an appreciable increase in the number of wafers produced per day, as compared with the throughput which is currently achievable.

In accordance with the present invention, this aim is achieved by the use of an improved rotary table workpiece transfer apparatus.

The present workpiece transfer apparatus provides for a compact "T-stub" configuration, which is very compact when compared to known feed systems. The configuration works well with a dual-lane (i.e. two parallel production lines) configuration, thus permitting single-sided operation. The production lines may be placed closely together and accessible by an operator.

The present transfer apparatus provides for a simplified belt component transfer system as opposed to conventional rotary table arrangements.

The present transfer apparatus allows a printed workpiece, such as a wafer, to return to its alignment position thus allowing the same inspection system to check the printed wafer. This makes it possible to employ closely-coupled closed loop print alignment and quality checking. These operations can be available at every print step at no extra increase in line length. No additional module is needed for inspection purposes.

The present transfer apparatus is more efficient than a standard rotary table, having less mass and less inertia.

The present transfer apparatus can operate at high speeds, achieving its move in about 300 ms, with a repeatability of <1 µm.

The present transfer apparatus can provide an optimised cycle time with resulting daily improvement in printed workpiece output.

SUMMARY OF THE INVENTION

This aim is achieved by using an optimised two-station rotary table arrangement.

In accordance with a first aspect of the present invention there is provided a transfer apparatus for conveying workpieces between a production line and a printing unit, comprising:

a rotary table supporting first and second platens at spatially separated locations thereon, each platen being rotatable with respect to the rotary table and also rotatable relative to the other platen about respective first and second platen rotation axes and configured to support a respective workpiece thereon in use;

the rotary table being rotatable about a table rotation axis, parallel to the first and second platen rotation axes, so that each platen can be moved between a loading position proximate the production line in use and a printing position proximate a printing unit in use, through rotation of said table; and a table drive device for rotating the rotary table about the table rotation axis;

wherein the transfer apparatus is operable to cyclically perform first and second movement operations, such that in the first movement operation the rotary table rotates to move the first platen from the loading position to the printing position while the second platen moves from the printing position to the loading position, and in the second movement operation the rotary table rotates to move the first platen from the printing position to the loading position while the second platen moves from the loading position to the printing position.

In accordance with a second aspect of the present invention there is provided a printing apparatus for printing workpieces, comprising an input for receiving workpieces from a production line, a transfer apparatus according to the first aspect, a printing unit, and an output for outputting printed workpieces to the production line.

In accordance with a third aspect of the present invention there is provided a printing assembly comprising the printing apparatus of the second aspect, and a production line, the printing apparatus coupled with said production line.

In accordance with a fourth aspect of the present invention there is provided a printing apparatus for printing workpieces, comprising an input for receiving workpieces from a production line, a printing unit, an output for outputting printed workpieces to the production line, and a transfer apparatus for conveying workpieces between the production line and the printing unit, wherein the transfer apparatus comprises:

a rotary table supporting first and second platens at spatially separated locations thereon; and a table drive device for rotating the table about a table rotation axis, to move each platen in use between a loading position located in-line between the input and the output, and a printing position proximate the printing unit;

wherein the transfer apparatus is operable to cyclically perform first and second movement operations, such that in the first movement operation the rotary table rotates to move the first platen from the loading position to the printing position while the second platen moves from the printing position to the loading position, and in the second movement operation the rotary table rotates to move the first platen from the printing position to the loading position while the second platen moves from the loading position to the printing position.

In accordance with a fifth aspect of the present invention there is provided a method for printing workpieces on a production line, comprising the steps:

a) providing a transfer apparatus including a rotary table supporting first and second platens at spatially separated locations thereon, each platen configured to support a respective workpiece thereon;

b) loading a first workpiece onto the first platen at a loading position proximate the production line while the second platen is located at a printing position proximate a printing unit;

c) performing a first movement operation, comprising rotating the rotary table to move the first platen to the printing position while the second platen moves from the printing position to the loading position;

d) printing the first workpiece using the printing unit;

e) performing a second movement operation, comprising rotating the rotary table to move the first platen from the printing position to the loading position, while the second platen moves from the loading position to the printing position; and f) unloading the first workpiece from the first platen to the production line;

wherein in each of the first and second movement operations, one of said first and second platens rotates relative to the other of said first and second platens.

Other specific aspects and features of the present invention are set out in the accompanying claims.

In a preferred embodiment, a transfer apparatus in accordance with the present invention includes two independent platens fixed at each end of a rotary table formed as a transfer arm. Each platen can rotate relative to the arm, allowing the platen to change its orientation between loading to unloading operations, thus allowing a loading conveyor provided on the platen, such as a paper conveyor, to be reciprocated with each workpiece load/unload operation. This means that a continuous or endless belt need not be used, greatly simplifying construction. Furthermore, when an inspection system associated with the printing assembly sees contamination or a fault with the paper conveyor, a fresh section of paper can be introduced thus automatically clearing contamination or print fault issues.

Advantageously, the ability to rotate platens enables each platen to be used as a "theta stage" to allow a wafer to be aligned and orientated for printing to any angle. In some cases this helps optimise print quality, using a technique known as vector printing.

Preferably, input and output production line conveyors may move in the vertical direction (conventionally referred to as the "Z direction"), e.g. lifted, to allow the platens to clear them during rotation of the table. This configuration allows for a compact design making dual-lane and single-sided operation practical.

BRIEF DESCRIPTION OF THE DRAWINGS

The invention will now be described with reference to the accompanying drawings, in which:

FIG. 10 schematically shows from above a second embodiment of the present invention using a dual-lane printing arrangement;

FIG. 11 schematically shows a perspective view of a printing apparatus in accordance with a third embodiment of the present invention, using an offset production line;

DETAILED DESCRIPTION OF THE PREFERRED EMBODIMENTS OF THE INVENTION

In the following description, the terms X, Y, Z and θ are used in their conventional way in this art: the Z-axis refers to the axis normal to the plane of the workpiece being printed, which will generally be in the vertical direction. The X-Y plane is co-planar with the plane of the workpiece, and hence normal to the Z-axis. θ refers to the angle of rotation of the workpiece about the Z-axis.

Figure 1:
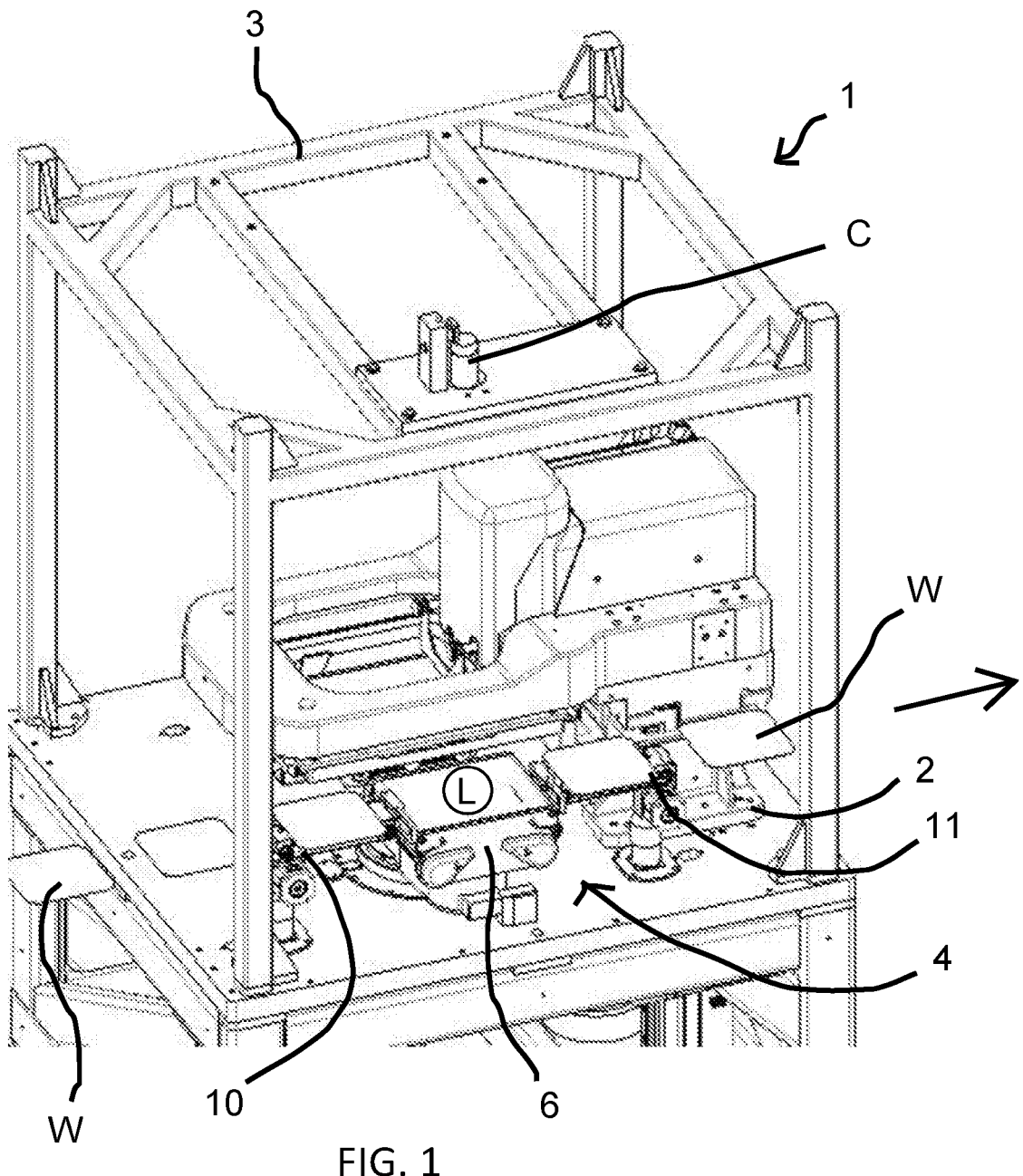
FIG. 1 schematically shows a perspective view of a single-lane printing apparatus in accordance with a first embodiment of the present invention.

A perspective view of a single-lane printing apparatus in accordance with a first embodiment of the present invention is schematically shown in FIG. 1.

The printing apparatus 1 comprises a support platform 2 mounted within a frame 3, with the support platform 2 supporting the major components described below. A plurality of workpieces W are shown in a single-lane production line, although for clarity conveyor belts which would form the production line are omitted from FIG. 1. As shown, workpieces W are conveyed to the printing apparatus 1 from the left side, are printed by the apparatus, and then are conveyed out to the right, following the direction of the arrow shown. After being conveyed into the printing apparatus 1, each workpiece W is sequentially conveyed to a loading position or zone L, ready for transport to a printing position or zone P by transfer apparatus 4, as will be described in detail below. A printing unit 5 is provided within the printing apparatus 1, supported by the support platform 2, for printing onto a respective workpiece W when in the printing position P. The printing unit 5 shown here is of a standard type known in the art, which during a printing operation causes conductive paste to be dispensed, "flooded" onto a printing screen and then applied to a workpiece W using a print head with a squeegee (not shown) which is aligned by print head alignment actuators under the control of a print head X, Y, θ alignment control means (not shown) and driven by print head actuators to move across the upper surface of a printing screen (not shown) in a printing direction. The conductive paste is forced through an image of apertures in the screen and onto a workpiece W located underneath the screen, forming a printing pattern corresponding to the screen image. Once printed, the workpiece W may be returned to the loading position L by the transfer apparatus 4, for onward conveyance along the production line. An optical inspection apparatus including an optical camera C, which is known in the art per se, is provided on the frame 3 above the loading position L, communicatively connected with the print head X, Y, θ alignment control means. The inspection apparatus is thereby able to inspect the alignment of workpieces W at the loading position L both before and after printing. In particular, the inspection apparatus is able to determine the rotational alignment of a workpiece W at the loading position L. This feature will be discussed in further detail below. The inspection apparatus may also be configured to inspect the print quality of the printed workpiece. In addition, upwardly-directed cameras UC1, UC2 (see FIGS. 9A to 9G) are provided below the printing position P to illuminate and inspect fiducials on the printing screen in use. The use of such cameras is known per se, and their location may be selected as appropriate.

Figure 2:
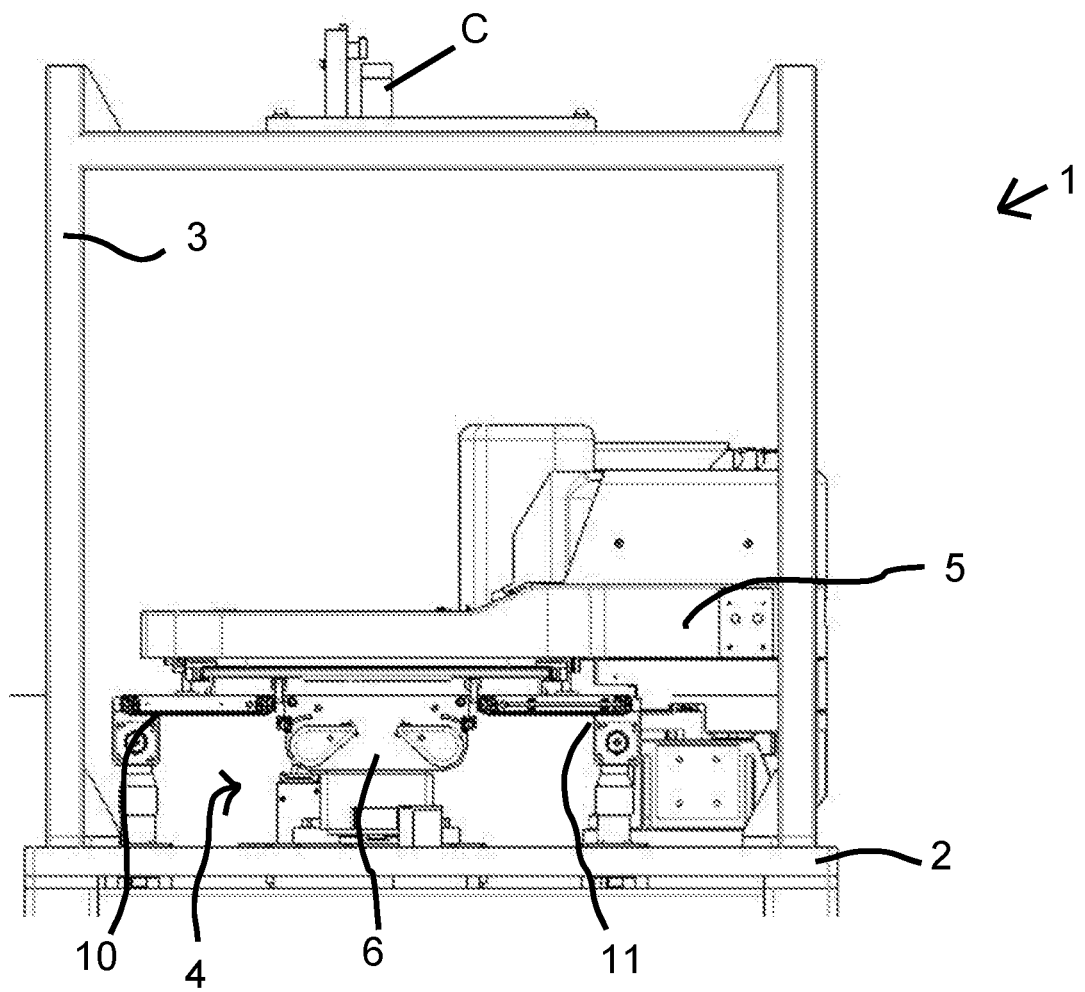
FIG. 2 schematically shows a side view of the apparatus of FIG. 1.
Figure 3:
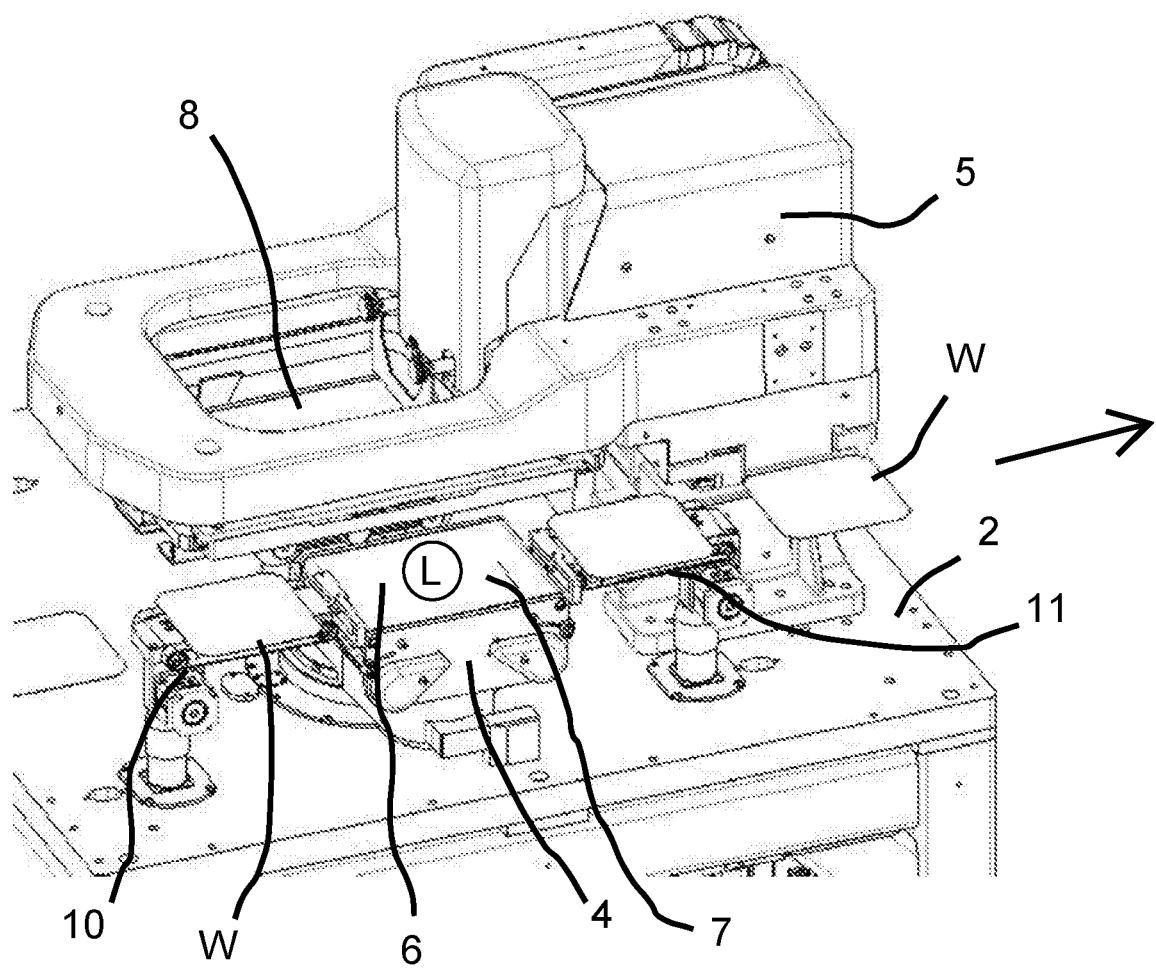
FIG. 3 schematically shows a perspective view of a printing unit of the printing apparatus of the first embodiment.
Figure 4:
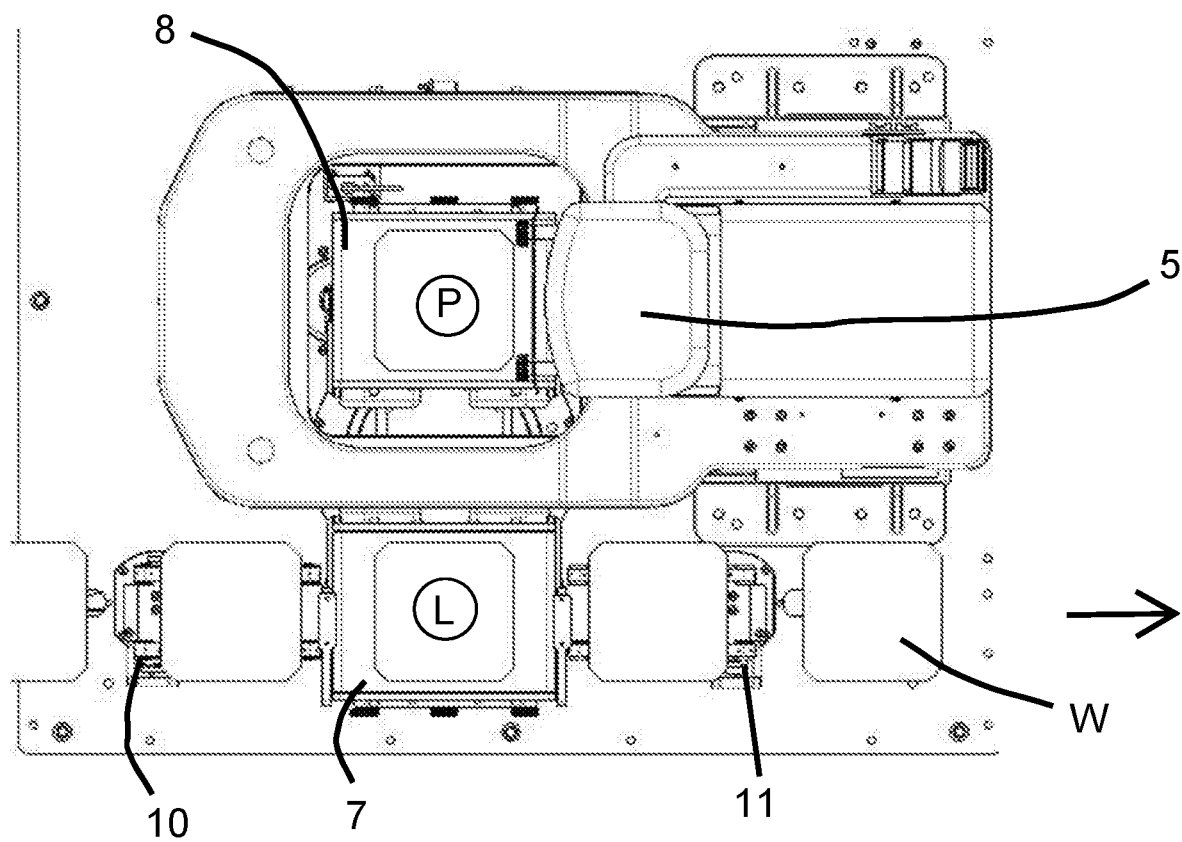
FIG. 4 schematically shows the printing unit of FIG. 3 from above.

FIG. 2 schematically shows a side view of the printing apparatus of FIG. 1, while FIG. 3 shows a perspective view of the printing unit 5 and transfer apparatus 4 and FIG. 4 shows a view of the same from above. It should be noted that here again the conveyors of the production line have been omitted for clarity. Various components of the transfer apparatus 4 can be seen in more detail. The transfer apparatus 4 includes a rotary table 6 which supports a first rotatable platen 7 shown at the loading position L and a second rotatable platen 8 located at the printing position P. Each platen 7, 8 comprises a belt 9 for supporting a workpiece W thereupon. In this embodiment, as is standard in the art, the belt 9 is formed as a paper roll. The belt 9 is drivable to move a workpiece W thereon, both to transport the workpiece to and from the production line, as will be described in more detail below, and also to provide for lateral alignment of the workpiece on the respective platen 7, 8. A first feed conveyor 10 is positioned proximate the loading position L which receives workpieces W from the upstream production line at an input thereof, for transporting the workpieces to the platen 7 currently at the loading position L. Additionally, a second feed conveyor 11 is positioned proximate the loading position L, for transporting workpieces W from the platen 7 currently at the loading position L to the downstream production line at an output thereof. This means that in this embodiment, the loading position L is located in-line between the input and the output. The printing apparatus 1 further comprises means for effecting relative vertical movement between the rotary table 6 and each feed conveyor 10, 11. In this embodiment, the first and second feed conveyors 10, 11 are movable in the vertical direction (conventionally denoted the "Z" direction), as will be described further below.

It can be seen from FIG. 4 that the printing apparatus is configured to form a "T-stub" arrangement with the production line, i.e. the input and output directions of workpieces are co-linear, and workpieces are taken out of the line for printing before being returned to it. This arrangement is particularly compact, and easily administered by operators.

Figure 5:
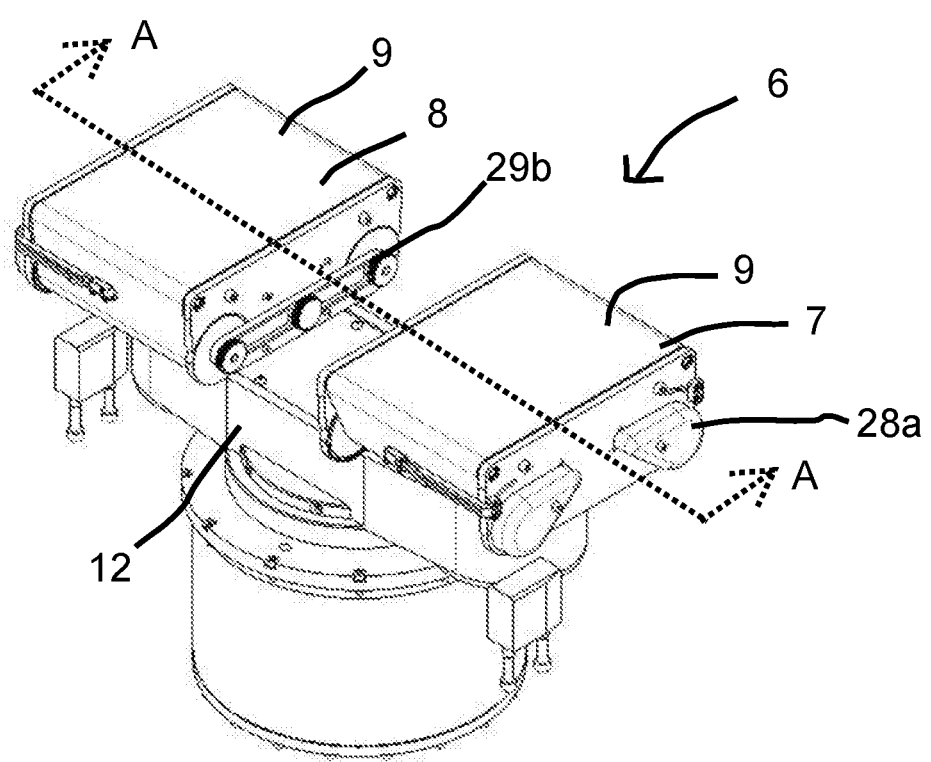
FIG. 5 schematically shows a perspective view of the rotary table of the printing apparatus of the first embodiment.
Figure 6:
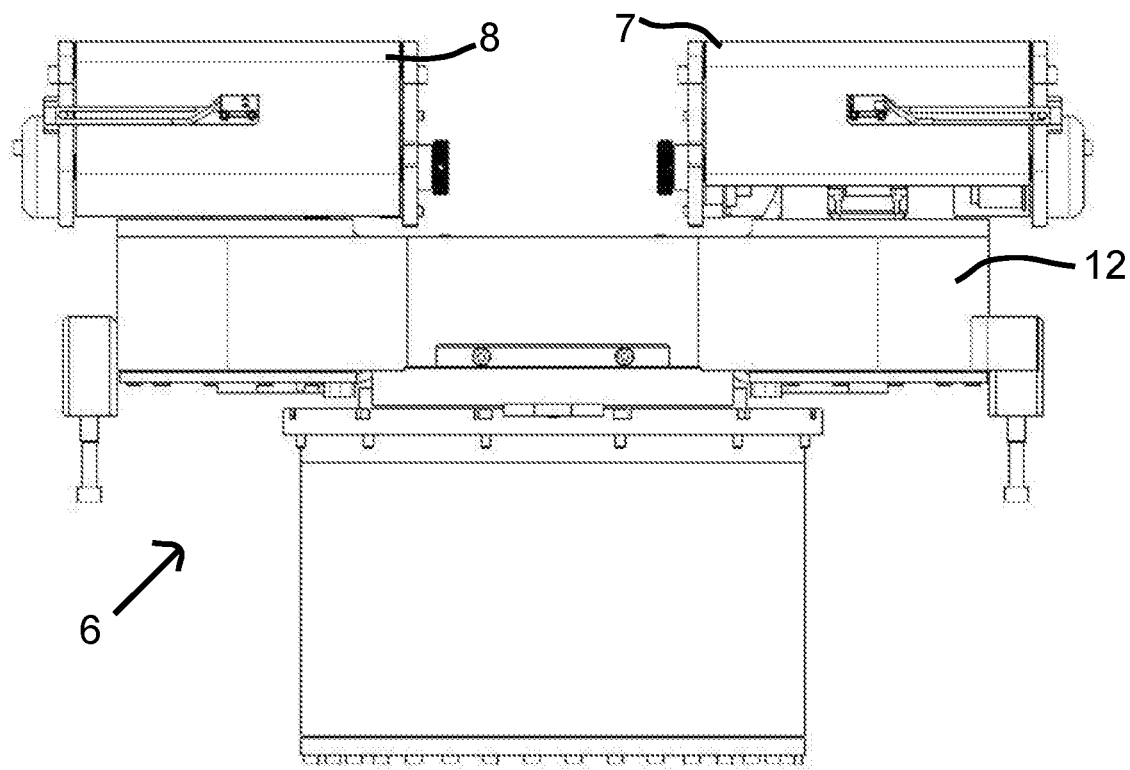
FIG. 6 schematically shows a side view of the rotary table of FIG. 5.
Figure 7:
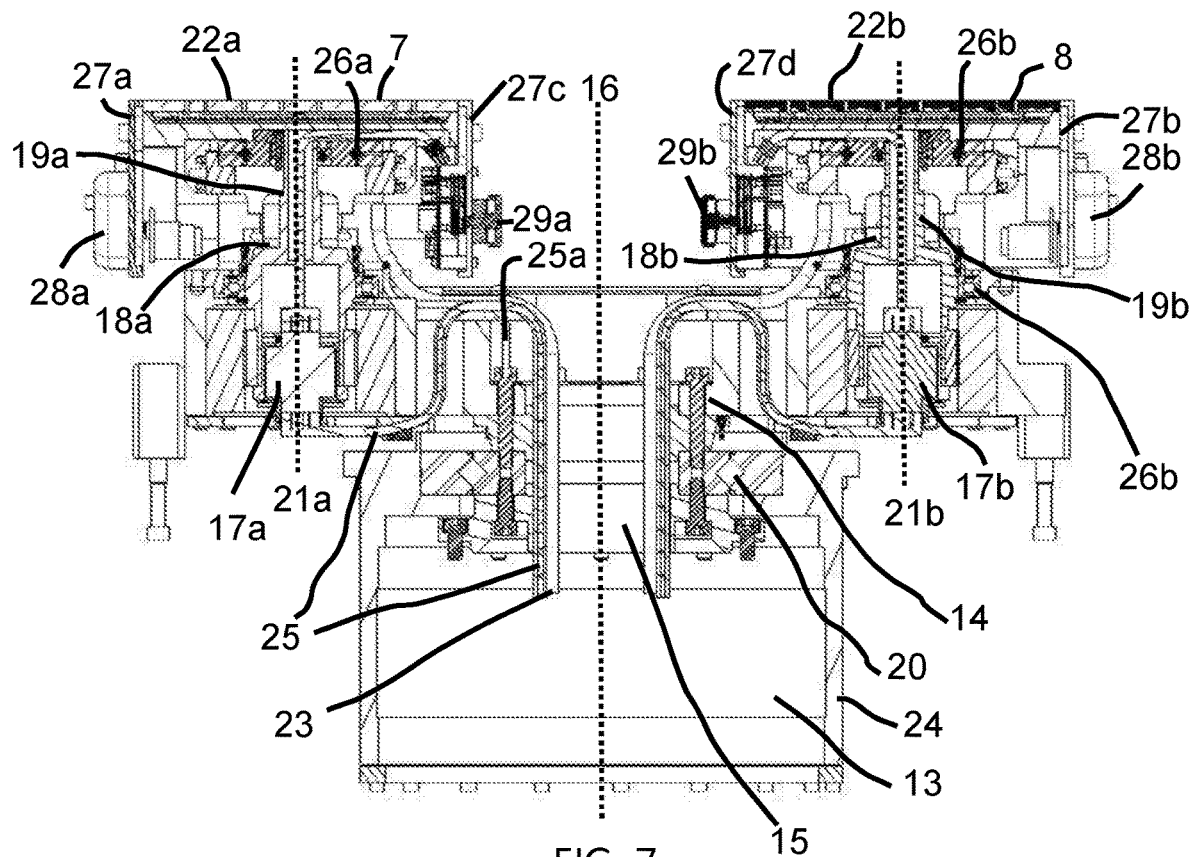
FIG. 7 schematically shows a sectional side view of the rotary table of FIG. 5.

FIG. 5 schematically shows a perspective view of the rotary table 6 in isolation, with a side view thereof schematically shown in FIG. 6 and a sectional view thereof, taken along the line A-A, schematically shown in FIG. 7. It can be seen that in this embodiment, the rotary table 6 takes the form of an arm 12, with the first and second rotatable platens 7, 8 fixed respectively in spatially separated locations at opposite ends of the arm 12. Located diametrically at the centre of the arm 12 and extending downwardly therefrom is a hollow central hub 15, mounted for rotation, via supporting bearings 20 with respect to a stationary support 24. An arm motor 13 is located within stationary support 24, underneath the hub 15, for producing rotary motion of the arm 12 about a vertical table rotation axis 16 orthogonal to the length of the arm 12 (which axis may be referred to as the "sun axis"). This rotary motion is controlled using an arm encoder having an arm encoder ring 14 mounted about the hub 15, with electrical power for the arm encoder being supplied via wires 25 passing up through hub 15. In alternative embodiments (not shown), the arm motor 13 may be located in an offset location, and transmission means such as gearing and/or drive belts or chains provided to effect rotation of the arm about the vertical table rotation axis 16. Each platen 7, 8 takes the general form of an inverted container, having a flat upper surface 22a, 22b and opposing dependent sidewalls 27a, 27c for the first platen 7 and 27b, 27d for the second platen 8. Each platen is supported on a respective stem 19a, 19b rotatably mounted at ends of the arm 12. Bearings 26a, 26b located at the upper and lower ends of respective stems 19a, 19b allow for the rotation of the stems 19a, 19b, and hence platen 7, 8, with respect to the arm 12. Each platen 7, 8 has a respective independent platen motor 17a, 17b drivingly connected to respective stem 19a, 19b and a platen encoder 18a, 18b mounted on the stem 19a, 19b for producing and controlling rotary motion of the respective stem 19a, 19b, and hence platen 7, 8, about a respective vertical axis 21a, 21b ("platen rotation axis" or "moon axis") parallel to the table rotation axis 16, so that each platen 7, 8 is independently rotatable relative to the rotary table 6. Electrical power for the platen motors and encoders 17a, b, 18a, b is provided by electrical wires 25 which are fed through hub 15.

As noted above, each platen 7, 8 includes means to feed a workpiece W on and off the platen via a belt 9 in the form of a reciprocating paper roll, though other materials and arrangements can be used, including endless belts. A first depending sidewall 27a, 27b of each platen 7, 8 supports a respective paper belt motor 28a, 28b, while an opposing depending sidewall 27c, 27d supports a respective paper roller 29a, 29b. Actuation of the paper belt motors 28a, 28b is controlled by an internal control chip (not shown) in communication with respective paper belt encoders (not shown) located proximate the paper belt motors. Power for the paper belt motors is supplied via wires 25. Each platen 7, 8 is provided with a controllable vacuum source provided via a vacuum feed tube 23 opening in communication with the belt 9, passing through hub 15 and supplying vacuum via a remote source (not shown) connected at its distal end. The paper belts 9 are porous, such that the applied vacuum may selectively constrain a workpiece W to the belt 9 to prevent slippage.

In this preferred embodiment, the arm motor 13 is operable to cause the arm 12 to reciprocate through approximately 180° between two fixed stops (not shown). In other embodiments, the arm motor 13 may be operable instead to continue to rotate the arm 12 a full 360° or alternatively to provide a continuous range of rotation. However, currently the reciprocal arrangement is preferred, since the provision of fixed stops allows for accurate and repeatable positioning of the arm 12. A 360° or greater range of motion on the other hand would require the use of moving stops, which are more complex to implement, and furthermore may involve tangling of wires within the central hub of the arm unless a complex rotary joint is employed.

Figure 8A:
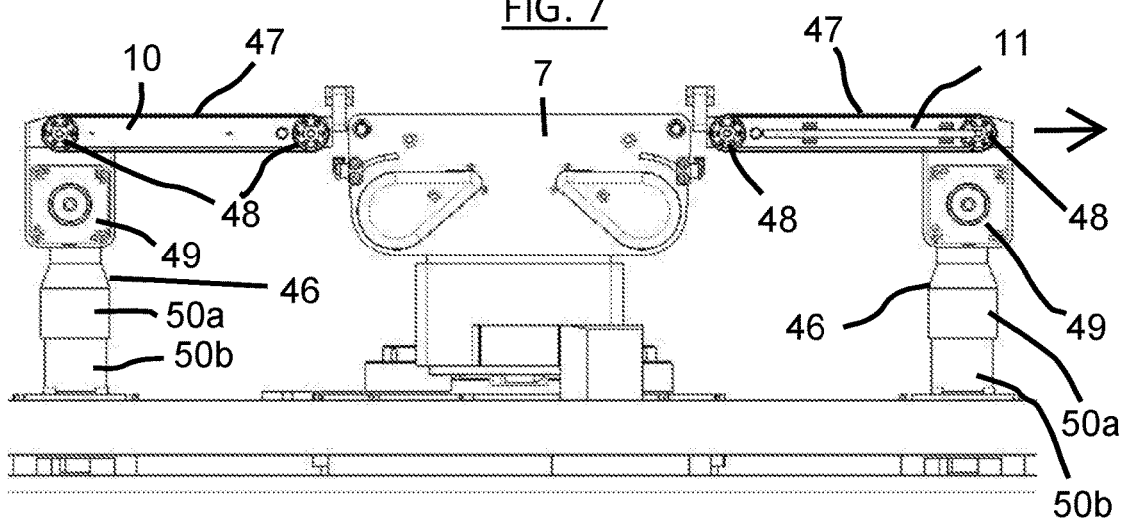
FIGS. 8A and 8B schematically show side views of the transfer apparatus of FIG. 1 with feed conveyors in a lowered and raised state respectively.

FIG. 8A schematically shows a side view of the transfer apparatus 4 with the feed conveyors 10, 11 in a lowered state. Feed conveyors 10, 11 are similarly constructed, each having an axially extending support tower 46, which supports a looped continuous conveyor belt 47 mounted on rollers 48 at each end thereof. Each conveyor belt 47 is driven by a respective driving means 49, operable to rotate at least one roller 48 and hence the supported belt 47. The upper surface of each conveyor belt 47 is configured for supporting a workpiece W thereon. In a preferred embodiment, a vacuum source (not shown) may be connected to each belt 47, to constrain a supported workpiece W thereto to prevent slippage. As previously noted, each support tower 46 is axially extendable, i.e. in the vertical or "Z-axis" direction, and comprises relatively movable telescopic members 50a, 50b to enable such extension. Drive means (not shown) for effecting the axial extension are provided at the base of the towers 46, for example within the support platform 2. These may for example comprise pneumatic or mechanical linear drive means, as are well known in the art per se. In FIG. 8A, the towers are shown in their retracted or lowered state, in which state the upper surfaces of conveyor belts 47 are substantially co-planar with the upper surface of platen 7, so that workpieces W may be transferred between platen 7 and the conveyor belts 47 safely, without excessive bending strain being applied thereto. It will be noted that each conveyor belt 47 has its inner end in close proximity to platen 7, which again is advantageous to avoid unwanted application of bending strain to the workpiece W. However, this close proximity also means that rotation of the rotary table 6 while the feed conveyors 10, 11 are in this state would cause the platen 7 and the feed conveyors 10, 11 to collide.

Figure 8B:
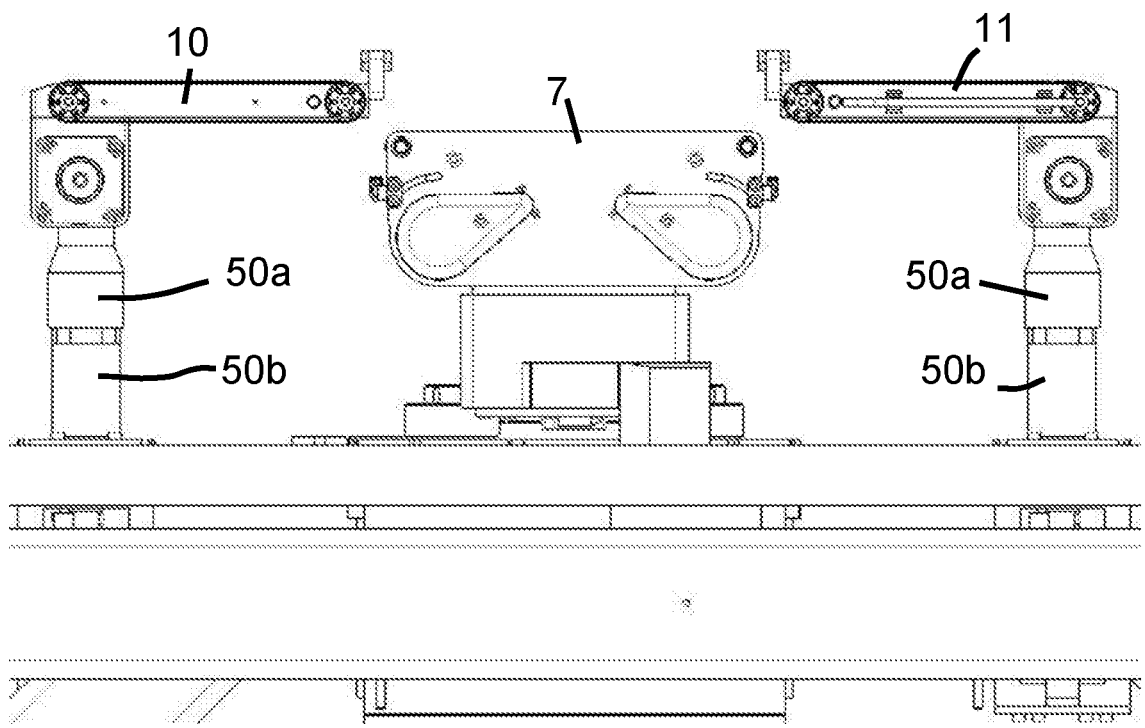

To avoid this problem, the feed conveyors are movable in the vertical direction, and FIG. 8B schematically shows a side view similar to that of FIG. 8A, but with the feed conveyors in a raised state, due to suitable actuation of the linear drive means. Here it can be seen that the support towers 46 are extended, such that the lower surface of conveyor belts 47 are at a higher vertical level than the upper surface of platen 7. In this configuration, the rotary table 6 may rotate freely, without impacting the feed conveyors 10, 11.

The operation of the printing apparatus 1, including the controlled actuation of arm and platen drive means, conveyor belt and platen belt driving, vacuum actuation and release, the printing operation and inspection are all controlled by a control means (not shown), such as a remotely-located processing means, preferably a computer with dedicated control software installed.

The operation of the printing apparatus 1 in accordance with this embodiment will now be described with reference to FIGS. 9A to 9G. For clarity, most of the printing unit 5 has been omitted from these figures, so that the operation of the transfer apparatus 4 can be seen more clearly. To enable the orientation of each workpiece W to be clearly seen, each workpiece W is shown with an arrow thereon, which arrow will remain fixed in orientation with respect to that workpiece.

Figure 9A:
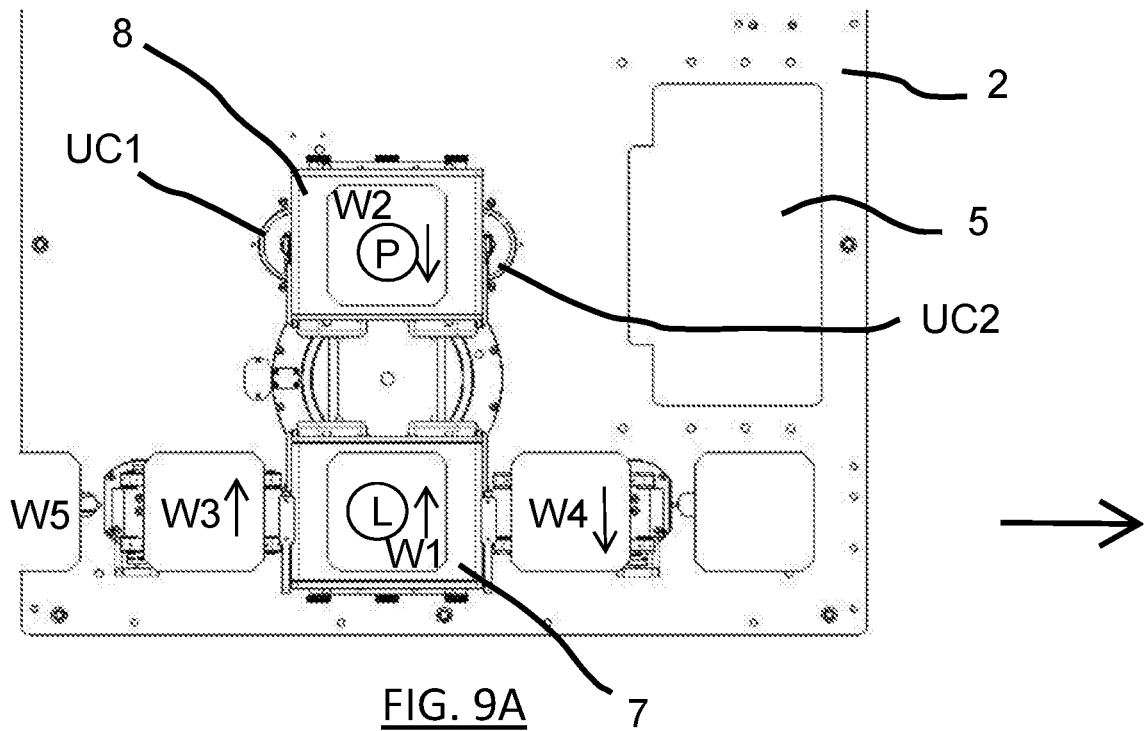
FIGS. 9A to 9G schematically show from above movement operation sequences in accordance with an embodiment of the present invention.

FIG. 9A schematically shows from above the printing apparatus 1 at a representative point in the printing procedure. First platen 7 is positioned at the loading position L, while second platen 8 is positioned at printing position P. A first workpiece W1 has been loaded onto first platen 7 from feed conveyor 10, in turn from the upstream production line. A second workpiece W2 is supported on second platen 8, at the printing position P, which workpiece W2 has just been printed. A third workpiece W3 is located on feed conveyor 10, having been received from the upstream production line. A fourth workpiece W4 is located on feed conveyor 11, for subsequent transfer to the downstream production line. The feed conveyors 10, 11 are in their lowered state, since loading of workpiece W1 onto first platen 7 and unloading of workpiece W4 from first platen 7 has only just occurred.

As soon as W1 is loaded onto first platen 7, camera C is used to capture an image of W1. This image provides alignment information for W1, which is sent to the print head X, Y, θ alignment control means, causing the print head alignment actuators to start moving to the latest alignment position so that the incoming workpiece and screen print image will be aligned and ready to print (in practice this alignment movement is completed during the following arm rotation).

In parallel to this, feed conveyors 10, 11 are raised up to their raised state.

Figure 9B:
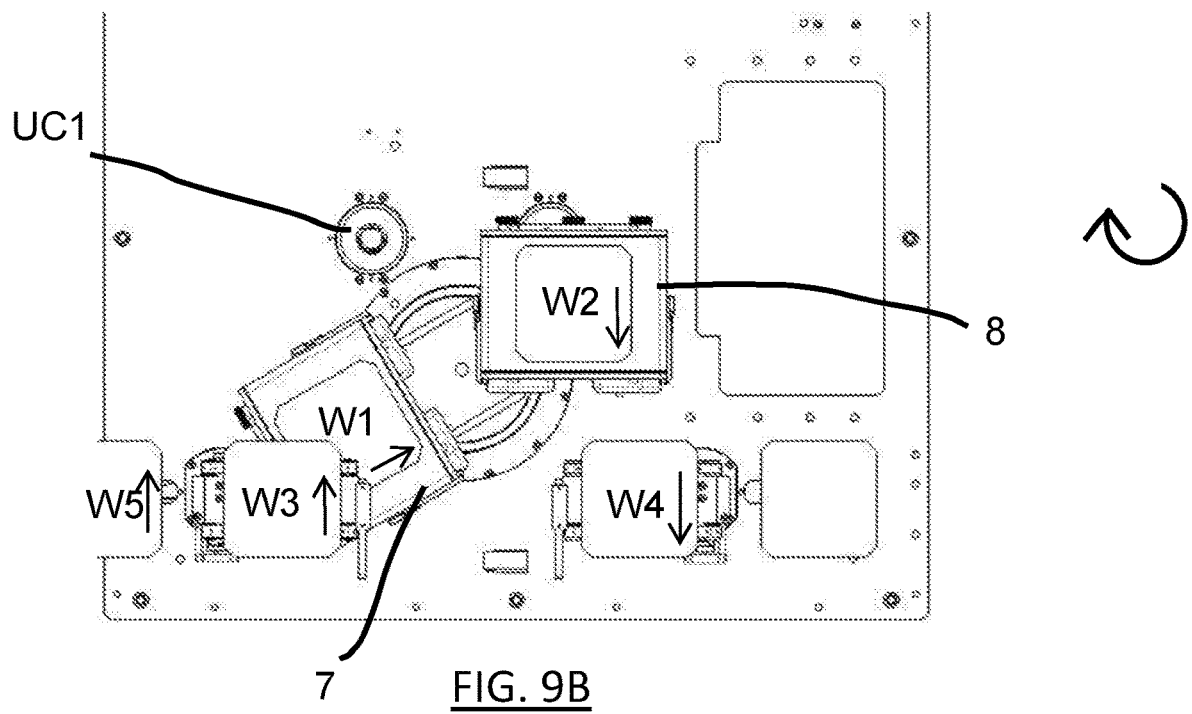

In FIG. 9B, the commencement of a first movement operation is shown from above, in which the rotary table 6 is caused to move in a clockwise rotational direction as shown, following completion of the printing of workpiece W2. In this first movement operation, platen 7 may safely travel from loading position L, towards printing position P, underneath input feed conveyor 10 since it is in its raised state. First platen 7, and workpiece W1 supported thereon may remain at a fixed angle with respect to the arm 12 during this movement. However, advantageously the first platen 7 may be rotated, during this arm rotation, as required e.g. for vector printing or error correction of the workpiece W1, by selective actuation of first platen motor 17, using first platen encoder 19, under the control of the control means. At the same time, second platen 8, with printed workpiece W2 supported thereon, moves from printing position P towards loading position L. During this first movement operation, the second platen 8 rotates relative both to arm 12 and first platen 7, this rotation being effected by the second platen motor 18, and controlled using second platen encoder 20. However, its absolute orientation, or rotational position relative to support platform 2, remains substantially unchanged. In this way the printed workpiece W2 is rotated around the platen axis by 180°, with the required driving direction of the belt 9 when loading and unloading the next workpiece reversed accordingly.

It should be noted that during the first movement operation, it may be necessary to raise the print head and screen in the vertical or Z-axis direction to allow the printed workpiece W2 to "escape" and to provide sufficient clearance for the incoming workpiece W1 to pass under the printing screen. The necessity of moving the print head in this way will depend on the print gap set by the operator for the print run. If any vertical movement of the print head is necessary, it will be moved to return to its original print height as soon as the platen has passed out of possible contact, which return will be completed by the point the arm 12 reaches its physical stop. Therefore there is no resulting impact on the cycle time.

Additionally, during the first movement operation the flood stroke takes place, in which the printing screen is flooded with conductive paste.

At this stage, in which neither platen obscures its view, upwardly-looking camera UC2 may illuminate and inspect fiducials of the printing screen.

The feed conveyors 10, 11 are lowered as soon as second platen 8 passes to the loading position L.

Figure 9C:
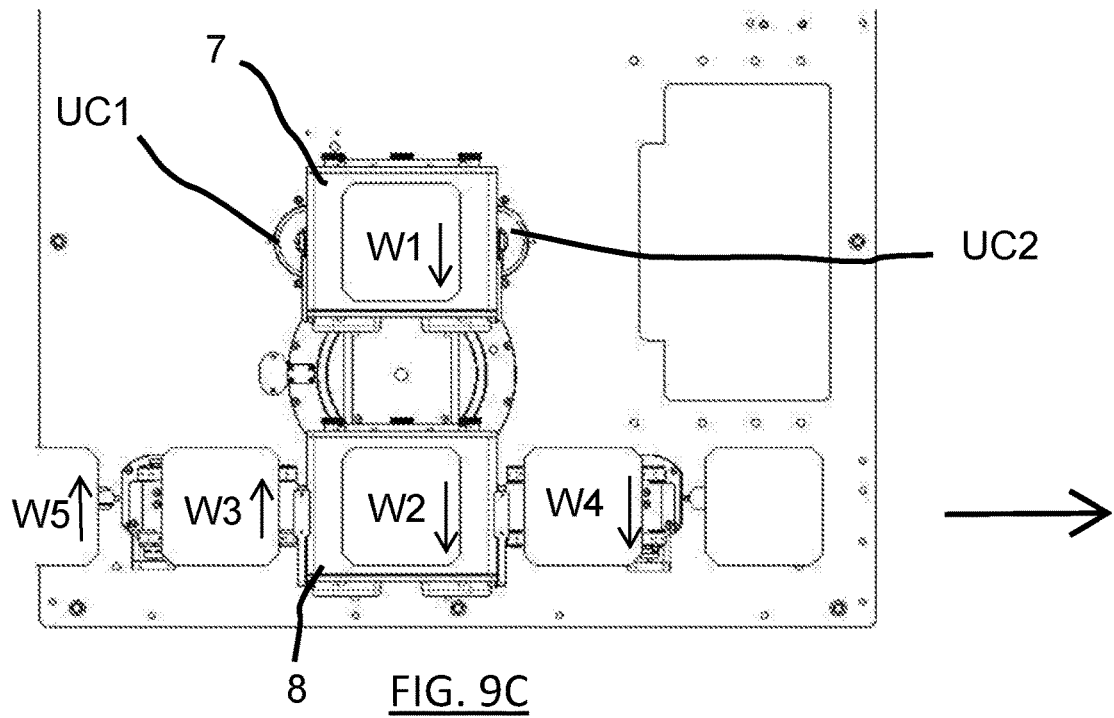

In FIG. 9C, which shows from above the arrangement at the end of the first movement operation, second platen 8 with printed workpiece W2 thereon has arrived at the loading position L, while first platen 7 with workpiece W1 thereon has arrived at the printing position P.

Printing of W1 commences when the correct orientation of workpiece W1 has been obtained, which as set out above will, barring a fault, have been completed during the first movement operation. In the meantime (i.e. during printing of workpiece W1), workpiece W4 is conveyed to the downstream production line, printed workpiece W2 is unloaded from second platen 8 to second feed conveyor 11, and workpiece W3 is loaded onto second platen 8 from first feed conveyor 10, through driving of the second platen belt 9 and feed conveyors 10, 11. The unloading of the printed workpiece W2 and loading the next workpiece W3 happen concurrently. In this operation, the belt 9 of the second platen 8 is rotated a set distance, for example by approximately the dimension of two workpieces, in a first direction. Also concurrently, a further workpiece W5 is conveyed onto first feed conveyor 10 from the production line.

Once in the loading position L on the second platen 8, workpiece W3 is in the field of view of the optical inspection system. In more detail, the trailing edge of the workpiece W3 is determined as it leaves the feed conveyor 10, at which time most of the workpiece W3 is on the second platen 8 and under vacuum control required to prevent any slippage due to its motion profile. A landed position of less than about 1 mm out of position may be achieved using this technique. The closer the landed position is to the actual alignment position, the better the accuracy of the final print and the better the cycle time. With the workpiece W3 stopped in the desired position, its alignment is captured optically by the inspection system, either by identifying the edges of the workpiece W3 or by identifying alignment points previously marked on the front surface of the workpiece. In alternative embodiments it is also possible to use a previously-printed workpiece as the alignment target.

Therefore it can be seen that alignment of the workpiece W3 at the loading position L and printing of workpiece W1 occur in parallel.

As soon as both these alignment and printing procedures are completed, the input and output feed conveyors 10, 11 are again raised and the print head alignment actuators move to the latest alignment position so that the incoming workpiece and screen print image will be aligned and ready to print.

Figure 9D:
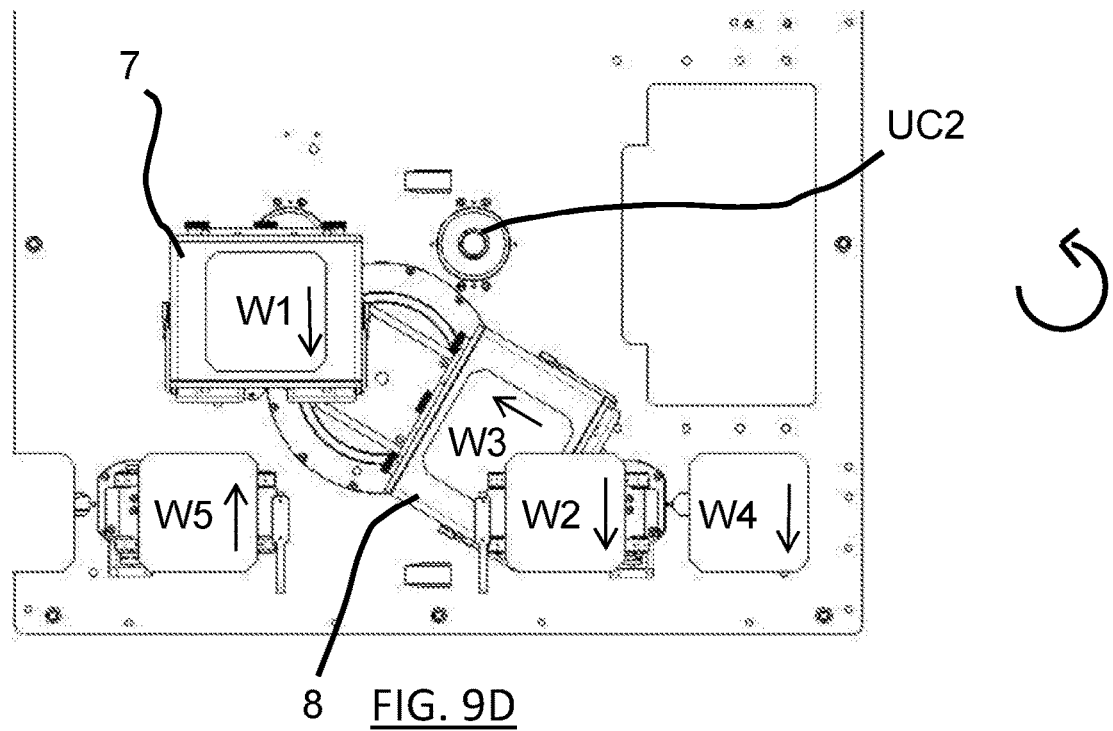
Figure 9E:
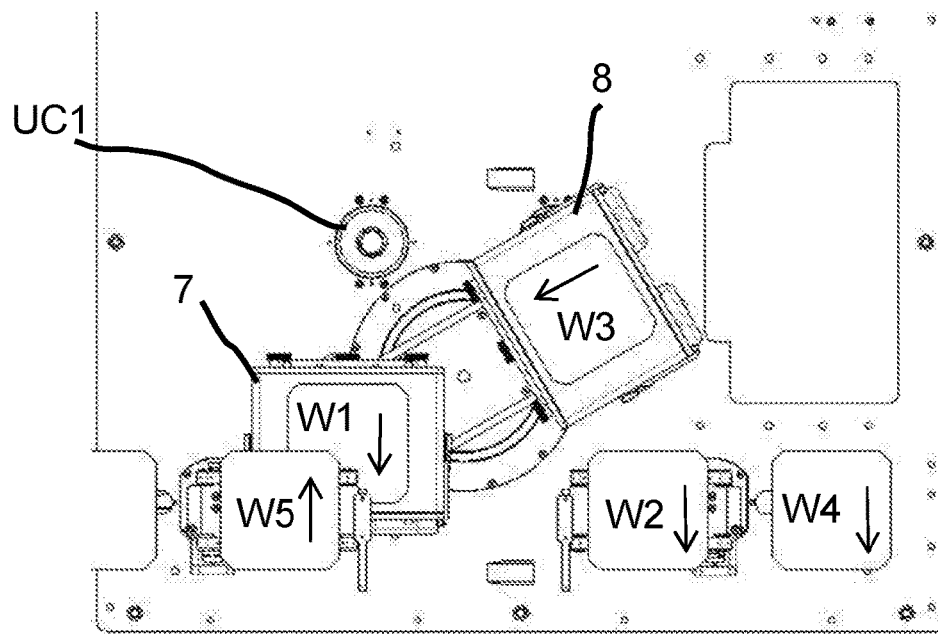

A second movement operation then commences. The raised feed conveyors 10, 11 allow the arm 12 to move unobstructed through 180°, this time in an anticlockwise direction, to move the workpiece W3 towards printing position P. FIGS. 9D and 9E schematically show, from above, the printing apparatus 1 at two successive instances after commencement of this second movement operation, in which in FIG. 9D the second platen 8 is passing underneath output feed conveyor 11, while in FIG. 9E the second platen 8 has cleared output feed conveyor 11 but first platen 7 is passing underneath raised input feed conveyor 10.

Second platen 8, and workpiece W3 supported thereon may remain at a fixed angle with respect to the arm 12 during this movement. However, advantageously the second platen 8 may be rotated, during this arm rotation, as required e.g. for vector printing or error correction of the workpiece W3, by selective actuation of second platen motor 18, using second platen encoder 20, under the control of the control means. At the same time, first platen 7, with printed workpiece W1 supported thereon, moves from printing position P towards loading position L. During this second movement operation, the first platen 7 rotates relative both to arm 12 and second platen 8, this rotation being effected by the first platen motor 17, and controlled using first platen encoder 19. However, its absolute orientation, or rotational position relative to support platform 2, remains substantially unchanged. In this way the printed workpiece W1 is rotated around the platen axis by 180°, with the required driving direction of the first platen's belt 9 when loading and unloading the next workpiece reversed accordingly.

As with the first movement operation, it is necessary to raise the print head and screen in the vertical or Z-axis direction to allow the printed workpiece W1 to "escape" and to provide sufficient clearance for the incoming workpiece W3 to pass under the printing screen.

Also during the second movement operation, the flood stroke takes place, in which the printing screen is flooded with conductive paste.

At this stage, in which neither platen obscures its view, upwardly-looking camera UC1 may illuminate and inspect fiducials of the printing screen.

The feed conveyors 10, 11 are lowered as soon as first platen 7 passes to the loading position L.

Figure 9F:
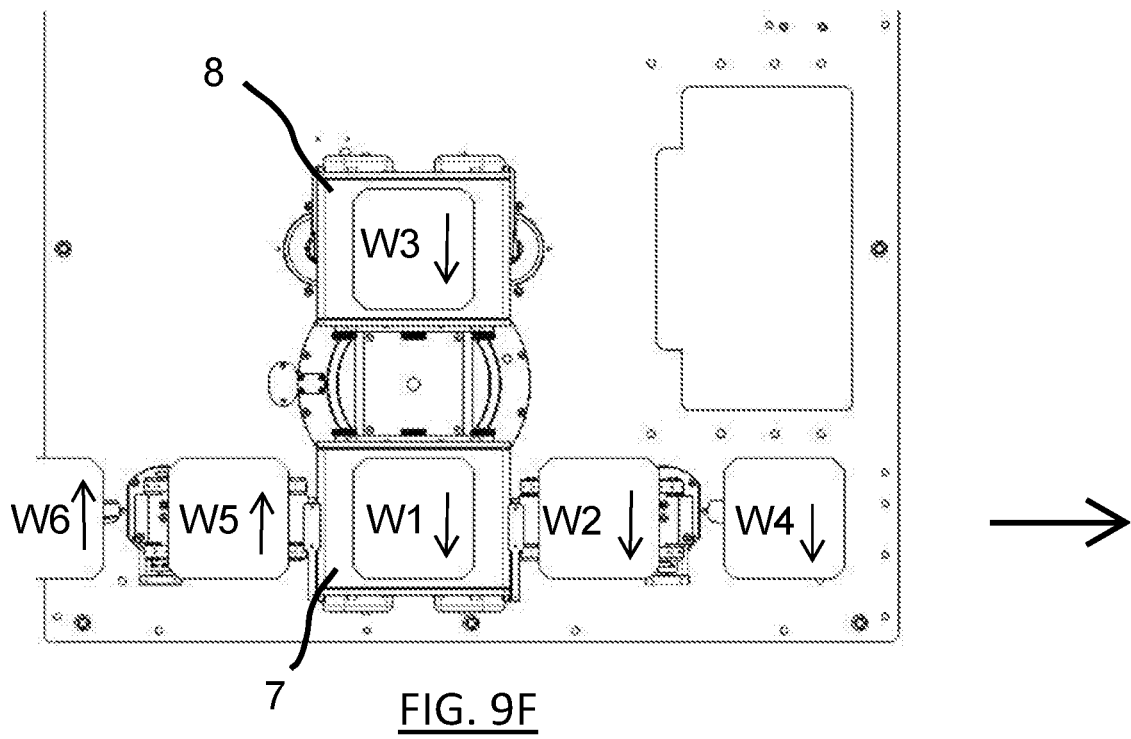

In FIG. 9F, which shows from above the arrangement at the end of the second movement operation, first platen 7 with printed workpiece W1 thereon has arrived at the loading position L, while second platen 8 with workpiece W3 thereon has arrived at the printing position P.

Figure 9G:
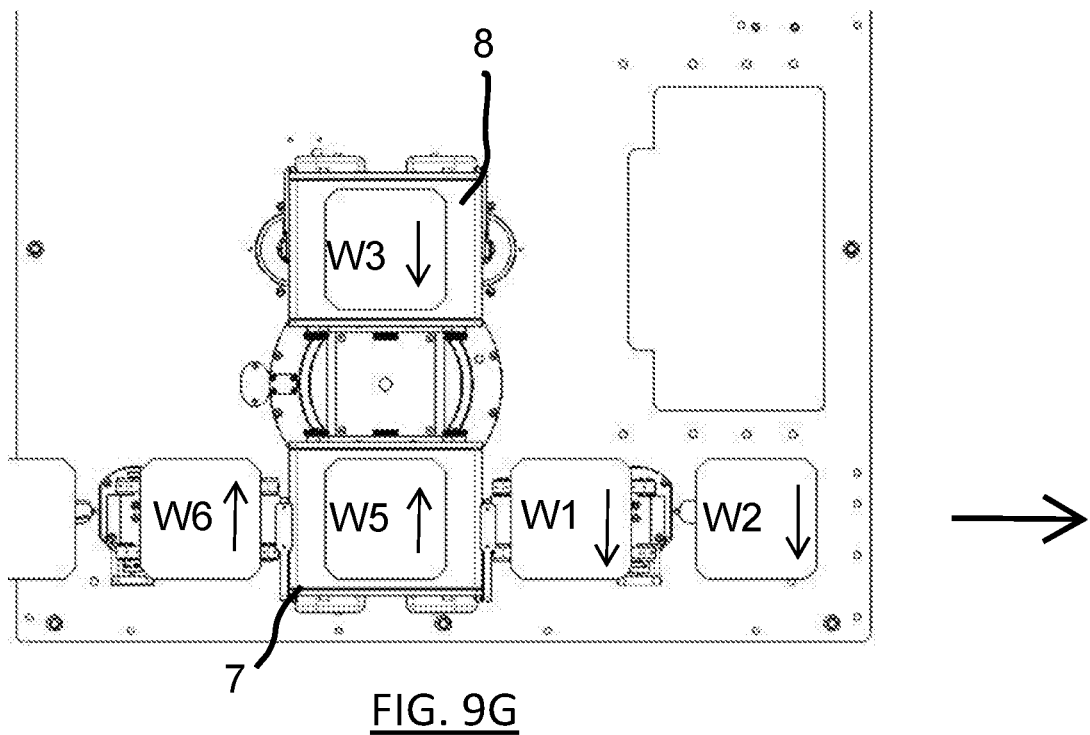

Printing of W3 commences when the correct orientation of workpiece W3 has been obtained, which as set out above will, barring a fault, have been completed during the second movement operation. In the meantime (i.e. during printing of workpiece W3), workpiece W2 is conveyed to the downstream production line, printed workpiece W1 is unloaded from first platen 7 to second feed conveyor 11, and workpiece W5 is loaded onto first platen 7 from first feed conveyor 10, through driving of the first platen belt 9 and feed conveyors 10, 11. The unloading of the printed workpiece W1 and loading the next workpiece W5 happen concurrently. In this operation, the belt 9 of the first platen 7 is rotated a set distance, for example by approximately the dimension of two workpieces, in a first direction. Also concurrently, a further workpiece W6 is conveyed onto first feed conveyor 10 from the production line. FIG. 9G schematically shows from above the arrangement following this parallel printing and loading/unloading step. FIG. 9G is therefore analogous to FIG. 9A, and thereafter the above-described steps are repeatedly cyclically.

A comparison of FIGS. 9A and 9G shows that while the platens 7, 8 have returned to their original locations, they are both rotated by 180°. This means that consecutive loading/unloading steps for each platen involves driving the associated belt in different directions. Therefore it is not necessary to use an endless belt, and a much simpler reciprocating belt arrangement may be used instead.

Over time, due to temperature or screen stretch, it is envisaged that the print repeatability may drift. Checking the print repeatability after every print operation by using the, or a separate, optical inspection apparatus and monitoring changes over time would allow offsets to be applied to compensate for any operational variations experienced.

FIG. 10 schematically shows a second embodiment of the present invention from above. Here a dual-lane printing arrangement is configured, using two separate printing apparatuses 30, 31. Each printing apparatus 30, 31 is substantially similar to the printing apparatus 1 of FIG. 1, and need not be described in detail. The arrangement shown provides for two separate production lanes 32, 33, with each lane feeding workpieces from left to right as shown. The printing apparatuses 30, 31 are arranged in a face-to face configuration, i.e. so that their respective support platforms and frames are adjacent but one apparatus 31 is rotated 180° relative to the other apparatus 30. In this way, each printing apparatus 30, 31 is arranged to print workpieces provided by different respective production lanes 32, 33, with apparatus 30 arranged to print workpieces from production lane 32, and apparatus 31 arranged to print workpieces from production lane 33. The compact "T-stub" arrangement of FIG. 4 is retained, with each stub associated with a respective production lane. It will be noted that the workpieces of production lane 32 will arrive at their respective printing apparatus and thus be printed before their counterparts on production lane 33, however the cycle time is unaffected by this discrepancy.

Importantly, the "T-stub" arrangement ensures that the distance between production lanes 32, 33 is relatively short, leading to a compact arrangement which is easily administered by operators.

FIG. 11 schematically shows a perspective view of a printing apparatus in accordance with a third embodiment of the present invention, using an offset production lane. In this embodiment, the transfer apparatus and printing unit are largely unchanged from the first embodiment, however the workpiece production line feed is now in an offset arrangement, such that the workpiece input direction and workpiece output direction are no longer co-linear. The input feed conveyor 40 used here is substantially L-shaped, comprising an input feed first belt 41 arranged parallel to the upstream production line for co-operation therewith, and an input feed second belt 42 arranged orthogonally to the production line, which receives workpieces from input feed first belt 41 and loads workpieces to the loading position. The output feed conveyor 43 used here is also substantially L-shaped, comprising an output feed first belt 44 arranged orthogonally to the production line, which unloads workpieces from the loading position L', and an output feed second belt 45 arranged parallel to the downstream production line for receiving workpieces from belt 44 and feeding them to the downstream production line.

This arrangement is not as compact as the previously-described "T-stub" arrangements, but may be preferred in certain locations.

Figure 12:
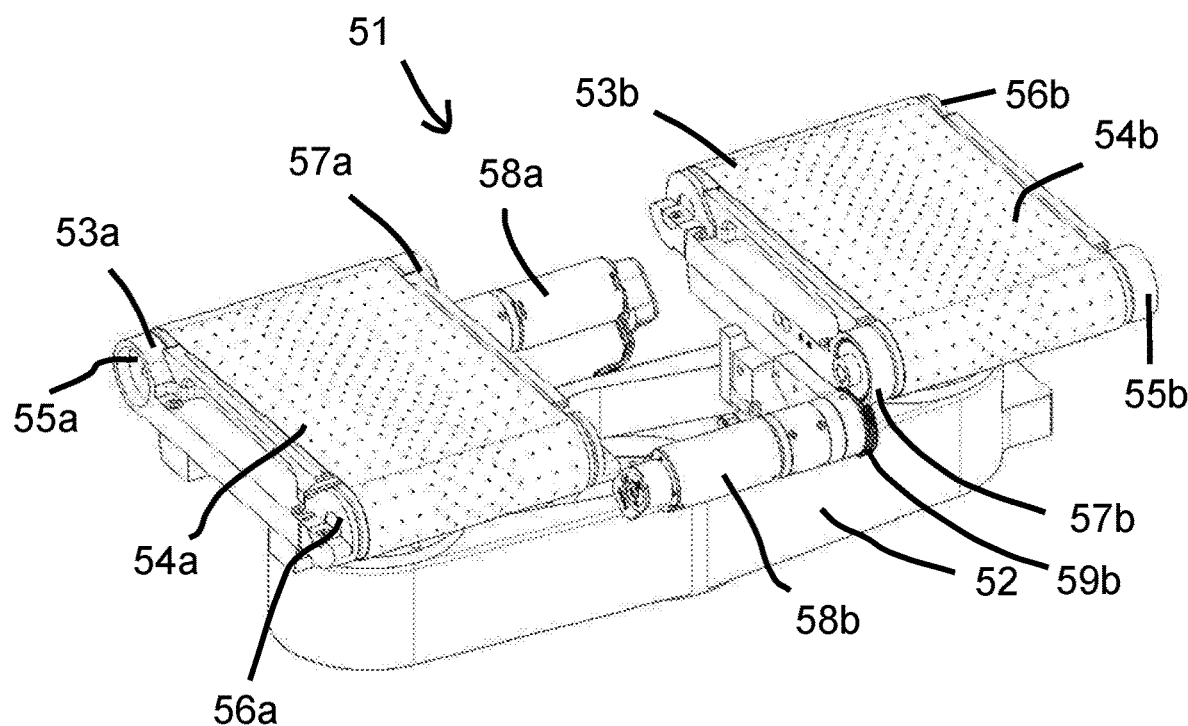
FIG. 12 schematically shows a perspective view of a transfer apparatus in accordance with a fourth embodiment of the present invention, using endless platen belts.
Figure 13:
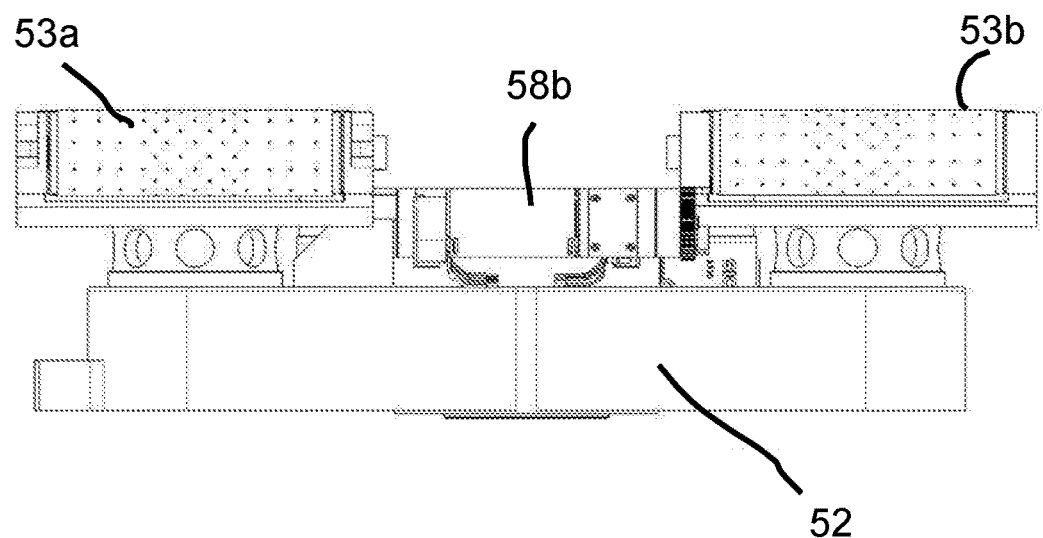
FIG. 13 schematically shows a side view of the transfer apparatus of FIG. 12.

FIG. 12 schematically shows a perspective view of a transfer apparatus 51 in accordance with a fourth embodiment of the present invention, using endless belts. FIG. 13 meanwhile shows a side view of this transfer apparatus.

This embodiment has many similarities with that of the first embodiment shown in FIGS. 1 to 9, such as the use of a two-platen rotary table to move workpieces between a loading position and printing position, together with the use of vertically-movable feed conveyors and therefore in particular retains the compact "T-stub" configuration of that embodiment. However, in this embodiment no means are provided to enable either platen to rotate relative either to the arm or the other platen. This provides several advantages compared to the first embodiment, such as:
i) reduced complexity of each platen; and
ii) each workpiece retains its original orientation at output.
However, there are also drawbacks, in particular:
i) theta angle rotation each platen is not possible; and
ii) it is necessary to use an endless belt at each platen.

The choice of implementation will depend on the particular situation.

Returning to FIGS. 12 and 13, transfer apparatus 51 includes a rotary table in the form of an arm 52. A platen 53a, 53b is mounted at each end of arm 52, each platen 53a, 53b being incapable of rotation with respect to the arm 52. Each platen 53a, 53b is provided with a respective endless or continuous paper belt 54a, 54b. Each belt 54a, 54b is mounted on respective rollers 55a, 56a, 55b, 56b located at the ends of the platens. A first roller 55a, 55b of each platen 53a, 53b has a circumferentially-toothed end 57a, 57b. Respective belt drive actuators 58a, 58b, mounted on arm 52, are operative to rotatably drive output gears 59a (not visible in FIG. 12), 59b, which mesh with the toothed ends 57a, 57b to cause them to rotate as required. A control chip (not shown) is provided within the transfer apparatus 51 to effect control of these actuators 58a, 58b. Each belt is porous, such that a vacuum can be applied to a workpiece (not shown) located on the top of the platen, to prevent unwanted movement thereof.

Figure 14:
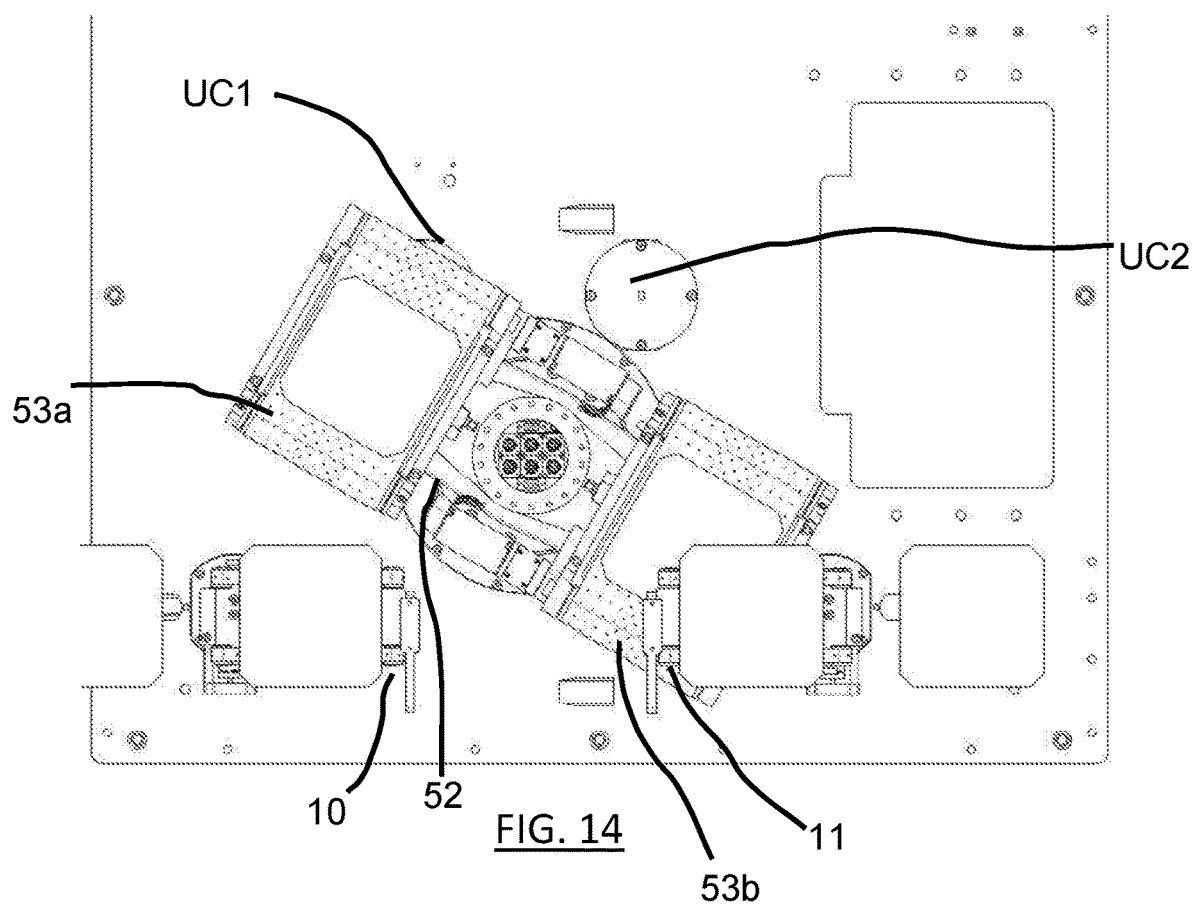
FIG. 14 schematically shows a plan view of the transfer apparatus of FIG. 12, during a loading operation.

FIG. 14 schematically shows a plan view of the transfer apparatus of FIG. 12, during a loading operation. It should be noted that the operation has many similarities with that of the first embodiment, and like reference numerals are retained where possible. In particular, first and second feed conveyors 10, 11 are again provided adjacent to a loading position, and these feed conveyors are moveable in the vertical direction to enable the arm 52 and platens 53a, 53b to pass underneath during transfer of workpieces between the loading and printing positions. Upwardly-directed cameras UC1, UC2 are located proximate a printing position. The remainder of the printing apparatus, while omitted for clarity, is identical to that of the first embodiment, except that here the print head should be capable of rotation to provide θ alignment, since the platens 53a, 53b cannot rotate. FIG. 14 clarifies that since neither platen 53a, 53b can rotate relative to the arm 52, each workpiece must be loaded onto a platen, and unloaded off the platen in the same direction, i.e. left to right as shown. This in turn means that the belt 54*a*, 54*b* of each platen 53*a*, 53*b* must be driveable in the same direction for both loading and unloading operations, and hence the use of continuous belts is preferred.

It should be noted that in this embodiment, the rotary table may rotate in either direction during either of the first and second movement operations.

The above-described embodiments are exemplary only, and other possibilities and alternatives within the scope of the invention will be apparent to those skilled in the art. For example:

i) While the first embodiment above uses a dedicated drive device to effect rotation of the first and second platens, this rotation may alternatively be driven using a transmission operatively connected with the arm motor. Such a transmission may comprise gearing and/or drive belts or chains as is well-known in the art. While this would provide advantages of simplicity, repeatability and reduced power requirements, theta angle rotation capability would be lost.

ii) The workpiece production lanes could be configured to stop at a number of positions to accommodate other processes. The platens could be configured to accept additional input and output conditions allowing a number of wafers to feed or unload between printing.

REFERENCE NUMERALS USED

1—Printing apparatus
2—Support platform
3—Frame
4—Transfer apparatus
5—Printing unit
6—Rotary table
7—First platen
8—Second platen
9—Belt
10—First feed conveyor
11—Second feed conveyor
12—Arm
13—Arm motor
14—Arm encoder ring
15—Hub
16—Sun axis
17*a*—First platen motor
17*b*—Second platen motor
18*a*—First platen encoder
18*b*—Second platen encoder
19*a*—First platen stem
19*b*—Second platen stem
20—Arm bearing
21*a*—First platen rotation axis
21*b*—Second platen rotation axis
22*a*—First platen upper surface
22*b*—Second platen upper surface
23—Vacuum feed tube
24—Stationary support
25—Wires
25*a*—Arm encoder wire
26*a*—First platen bearing
26*b*—Second platen bearing
27*a, c*—First platen sidewalls
27*b, d*—Second platen sidewalls
28*a*—First platen paper belt motor
28*b*—Second platen paper belt motor
29*a*—First platen paper roller
29*b*—Second platen paper roller
30—Printing apparatus
31—Printing apparatus
32—First production lane
33—Second production lane
40—Input feed conveyor
41—Input feed first belt
42—Input feed second belt
43—Output feed conveyor
44—Output feed first belt
45—Output feed second belt
46—Support tower,
47—Conveyor belt
48—Rollers
49—Conveyor belt driving means
50*a*, 50*b*—Telescopic members
51—Transfer apparatus
52—Arm
53*a*, 53*b*—Platens
54*a*, 54*b*—Endless paper belts
55*a*, 55*b*—First rollers 55*a*, 56*a*, 55*b*, 56*b*
56*a*, 56*b*—Second rollers
57*a*, 57*b*—Toothed ends
58*a*, 58*b*—Belt drive actuators
59*a*, 59*b*—Output gears
W—Workpiece
L—Loading position
P—Printing position
C—Camera
UC1, UC2—Upwardly directed cameras

The invention claimed is:

1. A transfer apparatus for conveying workpieces between a production line and a printing unit, the transfer apparatus comprising:
a rotary table supporting first and second platens at spatially separated locations thereon, each platen being rotatable with respect to the rotary table and also rotatable relative to the other platen about respective first and second platen rotation axes and configured to support a respective workpiece thereon in use;
the rotary table being rotatable about a table rotation axis, parallel to the first and second platen rotation axes, so that each platen can be moved between a loading position proximate the production line in use and a printing position proximate a printing unit in use, through rotation of said table; and
a table drive device for rotating the rotary table about the table rotation axis;
wherein the transfer apparatus is operable to cyclically perform first and second movement operations, such that in the first movement operation the rotary table rotates to move the first platen from the loading position to the printing position while the second platen moves from the printing position to the loading position, and in the second movement operation the rotary table rotates to move the first platen from the printing position to the loading position while the second platen moves from the loading position to the printing position
wherein each platen comprises a belt for transporting a workpiece thereon, and a belt drive for driving the belt, and the belt drive is operable to sequentially drive the belt in a first direction and in a second direction opposite to the first direction.

2. The transfer apparatus according to claim 1, wherein in each of the first and second movement operations, one of said first and second platens rotates relative to the other of said first and second platens, while the other of said first and second platens does not rotate.

3. The transfer apparatus according to claim 2, wherein in the first movement operation the second platen rotates relative to the rotary table with the first platen being stationary with respect to the rotary table, and in the second movement operation the first platen rotates relative to the rotary table with the second platen being stationary with respect to the rotary table.

4. The transfer apparatus according to claim 1, wherein the table comprises first and second platen drive devices for respectively rotating the first and second platens about their respective platen rotation axes.

5. The transfer apparatus according to claim 4, wherein the first and second platen drive devices are operable to selectively rotate respective first and second platens about their respective platen rotation axes by an angle θ.

6. The transfer apparatus according to claim 1, wherein the first and seconds platens are positioned at approximately 180° to each other about the axis of table rotation.

7. The transfer apparatus according to claim 1, further comprising a first feed conveyor positioned proximate the loading position for transporting workpieces from the production line to a platen at the loading position and a second feed conveyor positioned proximate the loading position for transporting workpieces from a platen at the loading position to the production line.

8. The transfer apparatus according to claim 7, further comprising respective drive actuators to sequentially move each feed conveyor to effect relative movement of each feed conveyor away from or towards the rotary table during each of the first and second movement operations.

9. A printing apparatus for printing workpieces, comprising an input for receiving workpieces from a production line, a transfer apparatus according to claim 1, a printing unit, and an output for outputting printed workpieces to the production line.

10. A printing assembly comprising the printing apparatus of claim 9, and a production line, the printing apparatus coupled with said production line.

11. The printing assembly according to claim 10, comprising a second production line and a second printing apparatus in accordance with claim 9 coupled therewith, the production line and the second production lines arranged in parallel, with said printing apparatus and said second printing apparatuses located between the first and second production lines.

12. A method for printing workpieces on a production line, the method comprising:
 a) providing a transfer apparatus including a rotary table supporting first and second platens at spatially separated locations thereon, each platen configured to support a respective workpiece thereon;
 b) loading a first workpiece onto the first platen at a loading position proximate the production line while the second platen is located at a printing position proximate a printing unit;
 c) performing a first movement operation, comprising rotating the rotary table to move the first platen to the printing position while the second platen moves from the printing position to the loading position;
 d) printing the first workpiece using the printing unit;
 e) performing a second movement operation, comprising rotating the rotary table to move the first platen from the printing position to the loading position, while the second platen moves from the loading position to the printing position; and
 f) unloading the first workpiece from the first platen to the production line;
 wherein in each of the first and second movement operations, one of said first and second platens rotates relative to the other of said first and second platens,
 wherein each platen comprises a belt for transporting a workpiece thereon, and a belt drive for driving the belt, and the belt drive is operable to sequentially drive the belt in a first direction and in a second direction opposite to the first direction.

13. The method according to claim 12, wherein in step b), a second workpiece, supported on the second platen is printed using the printing unit, and in step d) the second workpiece is unloaded from the second platen to the production line and a third workpiece is loaded to the second platen from the production line.

14. The method according to claim 12, wherein each platen comprises a belt for transporting a workpiece thereon, and a belt drive for driving the belt, and wherein in step b) the first workpiece is loaded onto the first platen by driving the belt in a first direction, and in step f) the first workpiece is unloaded from the first platen by driving the belt in a second direction opposite to the first direction.

* * * * *